(12) United States Patent
Lynch

(10) Patent No.: US 6,235,114 B1
(45) Date of Patent: May 22, 2001

(54) INTERDIGITIZED DISK WAVEFORM BAFFLE SYSTEM FOR DIRECTING FLUID STREAM AGAINST SUBSTRATE SHEET

(75) Inventor: Lyn R. Lynch, Mesa, AZ (US)

(73) Assignee: Coates Asi, Inc., Phoenix, AZ (US)

( * ) Notice: Subject to any disclaimer, the term of this patent is extended or adjusted under 35 U.S.C. 154(b) by 0 days.

(21) Appl. No.: 09/223,582

(22) Filed: Dec. 30, 1998

(51) Int. Cl.$^7$ .................................................... B05C 5/02
(52) U.S. Cl. .......................... 118/313; 118/316; 118/324
(58) Field of Search ............................... 118/239, 62, 63, 118/313, 316, 324, 304; 427/424; 198/780; 193/35 R; 271/264, 275, 314, 372

(56) References Cited

U.S. PATENT DOCUMENTS 4,607,590 * 8/1986 Pender ................................ 118/314

* cited by examiner

Primary Examiner—Laura Edwards
(74) Attorney, Agent, or Firm—Tod R. Nissle, P.C.

(57) ABSTRACT

A waveform baffle is interdigitized in a roller apparatus for applying fluids to substrates.

3 Claims, 2 Drawing Sheets

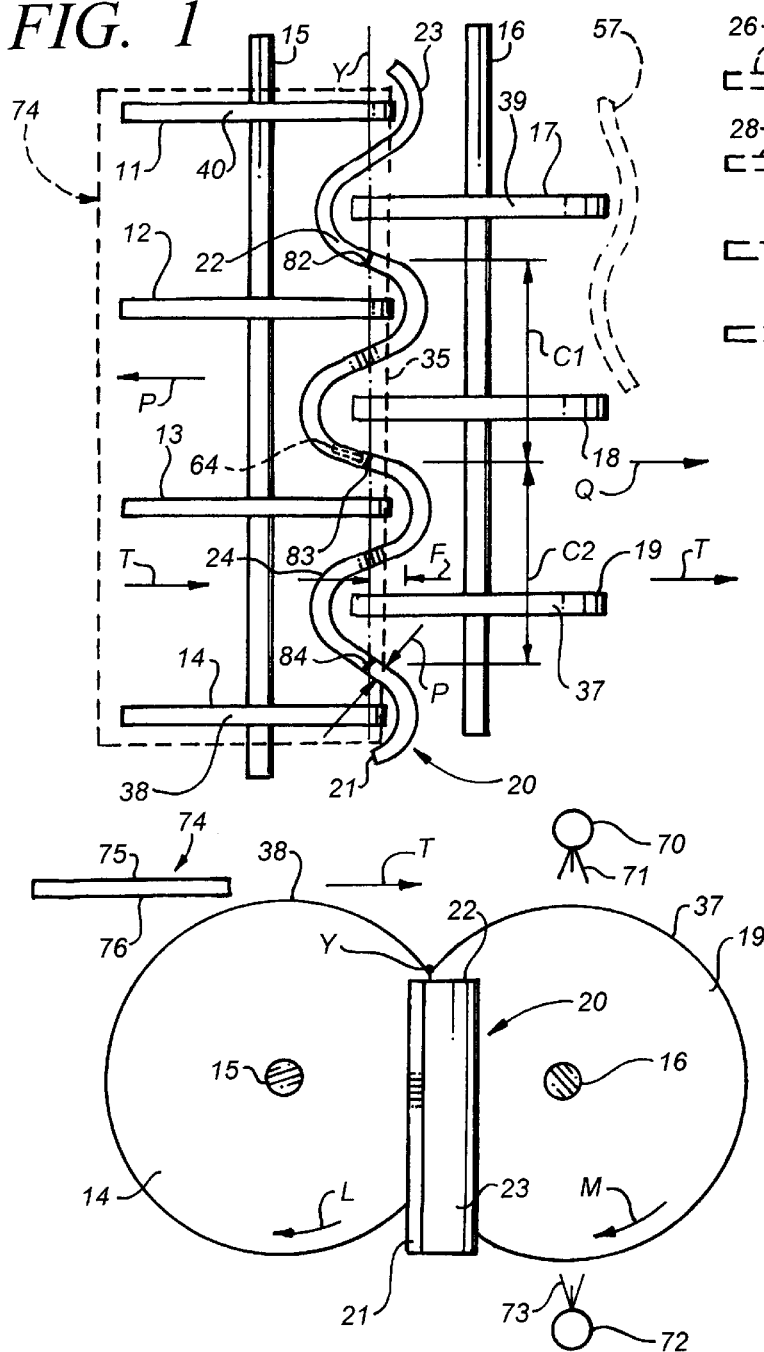
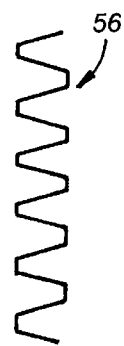
FIG. 1
FIG. 3
FIG. 4
FIG. 2

INTERDIGITIZED DISK WAVEFORM BAFFLE SYSTEM FOR DIRECTING FLUID STREAM AGAINST SUBSTRATE SHEET

This invention relates to apparatus for directing a stream of etching fluid or other fluid against a substrate traveling through the apparatus.

More particularly, the invention concerns apparatus for contacting a thin, pliant circuit board sheet with pressurized streams of fluid to form a liquid coating over the surface of the substrate.

In a further respect, the invention concerns apparatus of the type described which tends to prevent fluid in one portion of the apparatus from traveling into and contaminating a second adjacent portion of the apparatus.

In another respect, the invention concerns apparatus of the type described which includes a non-contact barrier that functions to retain process fluids with a defined process chamber or space.

Involute apparatus for spraying rectilinear circuit board substrate material is well known in the art. See, for example, U.S. Pat. No. 4,607,590 to Pender. In Pender a conveyor system moves panels of circuit board sheet material past units which direct spray against the upper and lower planar surface of the panels. The conveyor system includes a series of parallel, spaced rotating axles each fixedly carrying a plurality of vertically disposed isodiametric spaced disks. The intercatenated disks of one syndetic axle are staggered in relation to the disks on immediately adjacent axles in the same manner that adjacent rows of seats in a movie theater are staggered. The spaced disks on one axle extend past an imaginary line tangential to the periphery of the disks on an adjacent syndetic axle and, therefore, extend into the interstices between the disks carried by the adjacent axle. In other words, the disks on one axle intermesh and are interdigitized with the disks on the adjacent axle.

One problem long associated with intedigitized disk assemblies is that it is not possible to insert a panel or baffle between the disks on one axle and the disks on another successive parallel axle in order to prevent fluid from traveling from one portion to another portion of the apparatus. The interdigitization of the disks on one axle with the disks on the other axle prevents the use of a baffle wall which extends between the axles. As a result, a pair of axles carrying disks has to be separated a distance sufficient both to prevent interdigitization of disks and to form a space which permits the insertion of a baffle between the disks on one axle and the disks on the other axle. Such separation of an axle pair is not desirable when a thin pliable substrate is passing through the apparatus because the leading edge of the substrate can curl and "dive" down into the space between the disks on one axle and the disks on the next successive adjacent axle.

Accordingly, it would be highly desirable to provide improved disk assemblies which would permit the interdigitation of disks and which would permit a baffle panel to be incorporated between a first axle carrying disks and a second axle which is parallel to the first axle and carries disks that are interdigitized with disks on the first axle.

Therefore, it is a principal object of the invention to provide an improved apparatus for contacting a substrate with a fluid.

A further object of the invention is to provide an improved apparatus of the type described which includes a first axle carrying spaced apart disks and a second axle generally parallel to the first axle and carrying spaced apart disks which are interdigitized with the disks on the first axle.

Another object of the invention is to provide improved apparatus of the type described including a baffle extending between adjacent, successive, parallel pairs of axles each carrying disks interdigitzed with disks on the other of the axle pair.

These and other further and more specific objects and advantages of the invention will be apparent to those skilled in the art from the following detailed description thereof, take in conjunction with the drawings, in which:

FIG. 1 is a top view illustrating a interdigitzed disk-waveform baffle apparatus constructed in accordance with the principles of the invention;

FIG. 2 is a front view of the apparatus of FIG. 1 further illustrating construction details thereof;

FIG. 3 is a top view illustrating another embodiment of a waveform baffle apparatus constructed in accordance with the principles of the invention;

FIG. 4 is a top view illustrating a further embodiment of a waveform baffle apparatus utilized in the invention;

Figure 5:
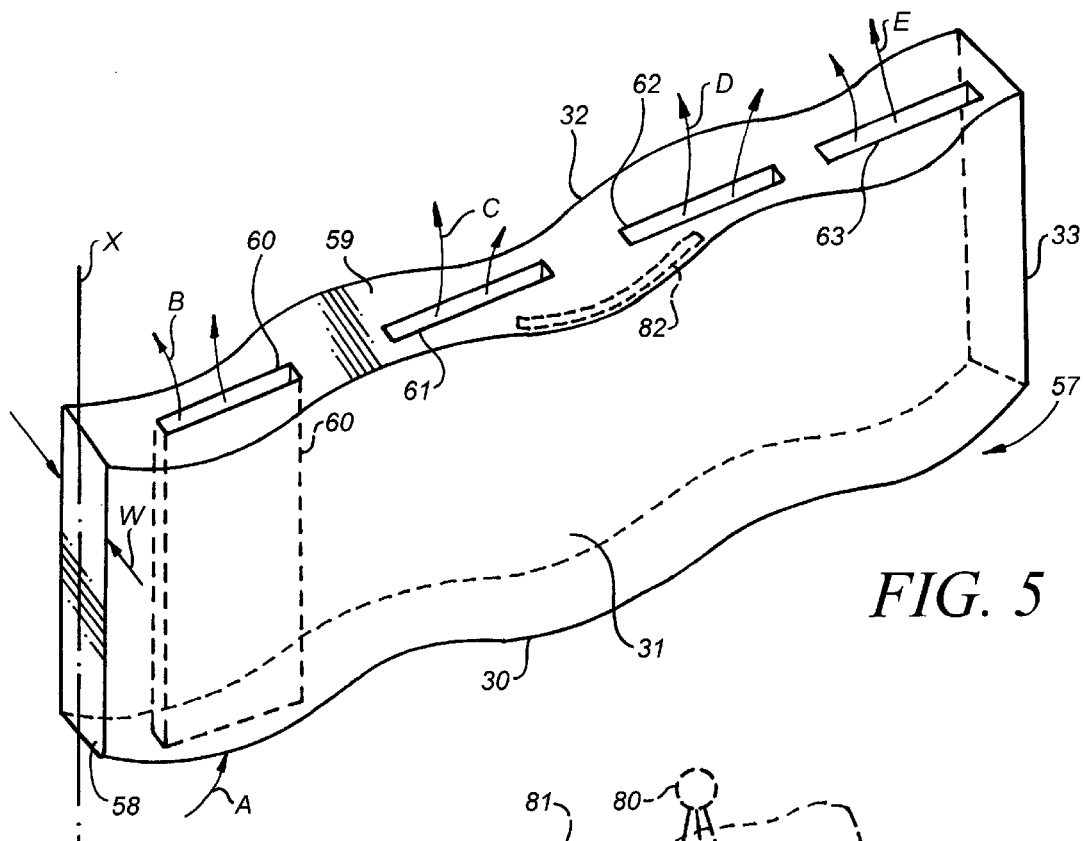
FIG. 5 is a perspective view illustrating still another embodiment of a waveform baffle apparatus utilized in the invention; and, FIG. 6 is a side elevation view illustrating the travel of a pliable substrate through an interdigitized disk assembly.

Briefly, in accordance with my invention, I provide an improved apparatus for directing a stream of fluid against a substrate traveling through the apparatus. The sheet has first and second opposed generally parallel planar surfaces. The apparatus includes a conveyor table for transporting the substrate. The conveyor table includes a first horizontally disposed axle carrying a first set of circular rollers contacting and supporting the first planar surface of the substrate in a generally horizontal orientation as the sheet moves over the rollers, and a second horizontally disposed axle generally parallel to the first axle and carrying a plurality of circular rollers contacting and supporting the first planar surface of the substrate in a generally horizontal orientation as the sheet moves over the rollers on the second axle. The rollers on the second axle are interdigitized with the rollers on the first axle. A waveform-shaped baffle is interdigitized with the rollers on the first axle and the rollers on the second axle.

In another embodiment of the invention, I provide an improved method for separating a first portion of treatment apparatus from a second portion of treatment apparatus. The treatment apparatus directs a stream of fluid against a substrate traveling through the apparatus. The substrate has first and second opposed generally parallel planar surfaces. The apparatus includes a conveyor table for transporting the substrate. The conveyor table includes a first horizontally disposed axle carrying a first set of circular rollers contacting and supporting the first planar surface of the substrate in a generally horizontal orientation as the substrate moves over the rollers; and, a second horizontally disposed axle generally parallel to the first axle and carrying a plurality of circular rollers contacting and supporting the first planar surface of the substrate in a generally horizontal orientation as the sheet moves over the rollers on the second axle. The rollers on the second axle are interdigitized with the rollers on the first axle. The improved method includes the step of interdigitizing a waveform-shaped baffle with the rollers on the first axle and the rollers on the second axle. Each half-cycle portion of the baffle extending around one of the interdigitized disks on the first axle has an amplitude sufficient to curve around the interdigitized disk and is connected to a half-cycle portion of the baffle extending around one of the interdigitzed disks which is on the second axle and is adjacent the one of the disks on the first axle.

In a further embodiment of the invention, I provide improved apparatus for directing a stream of fluid against a substrate traveling through the apparatus. The substrate has first and second opposed generally parallel planar surfaces. The improved apparatus includes a conveyor table for transporting the substrate. The conveyor table includes a first horizontally disposed axle carrying a first set of circular rollers contacting and supporting the first planar surface of the substrate in a generally horizontal orientation as the substrate moves over the rollers; and, a second horizontally disposed axle generally parallel to the first axle and carrying a plurality of circular rollers contacting and supporting the first planar surface of the substrate in a generally horizontal orientation as the substrate moves over the rollers on the second axle. The improved apparatus also includes a waveform shaped baffle interdigitized with the rollers on the first axle and the rollers on the second axle to remove fluid from the substrate.

Turning now to the drawings, which depict the presently preferred embodiments of the invention for purposes of illustrating the invention and not by way of limitation of the scope of the invention and in which like reference characters refer to corresponding elements throughout the several views, FIGS. 1 and 2 illustrate apparatus for directing streams 71, 73 from conduits 70 and 72, respectively, against a pliant substrate sheet or other substrate 74 traveling through the apparatus in the direction of arrow T. The substrate sheet 74 has first and second opposed generally parallel planar surfaces 75, 76. The apparatus includes a conveyor table for transporting the pliant substrate sheet 74. The conveyor table includes a first horizontally disposed axle 15 carrying a first set of circular rollers 11 to 14 contacting and supporting planar surface 76 of substrate sheet 74 in a generally horizontal orientation as sheet 74 moves over rollers 11 to 14. The conveyor table also includes a second horizontally disposed axle 16 generally parallel to the first axle 15 and carrying a plurality of circular rollers 17 to 19 contacting and supporting planar surface 76 of substrate sheet 74 in a generally horizontal orientation as sheet 74 moves over rollers 17 to 19 on the second axle. Rollers 17 to 19 are interdigitized with (and extend between) rollers 11 to 14.

Waveform-shaped baffle 20 is interdigitized with rollers 11 to 14 and 17 to 19. Portions of baffle 20 extend between roller pair 17-18 and roller pair 18-19. Portions of baffle 20 extend between roller pairs 11-12, 12-13, and 13-14.

Rollers 11 to 14 and 17 to 19 each have an equivalent diameter and width. In FIGS. 1 and 2, rollers 11 to 14 and 17 to 19 each comprise a relatively thin disk. The diameter and width of each roller 11 to 14, 17 to 19 can, however, vary as desired.

Rollers 11 to 14 are fixedly attached to axle 15 and rotate simultaneously with axle 15 in the direction of arrow L. Rollers 17 to 19 are fixedly attached to axle 16 and rotate simultaneously in the direction of arrow M.

The cylindrical outer peripheral surface 38 of roller 14, the cylindrical outer peripheral surface 40 of roller 11, the cylindrical outer peripheral surface 39 of roller 17, and the cylindrical outer peripheral surface 37 of roller 19, as well as the cylindrical outer pierpheral surfaces of rollers 12, 13, 18, contact surface 76 of substrate sheet 74 when substrate sheet 74 is moved in the direction of arrow T by rollers 11 to 14 and 17 to 19.

Baffle 20 is in a substantially rigid waveform and comprises a scalloped wall or panel. As used herein a wave is an oscillation propagated from point to point and definable by a mathematical specification of the amplitude and frequency (i.e., number of cycles in a given distance). Baffle 20 has a waveform similar to that of a sine wave. The shape and dimension of baffle 20 can vary as desired and can take on the waveform of baffle 25 in FIG. 3 or the waveform of baffle 56 in FIG. 4.

Figure 6:
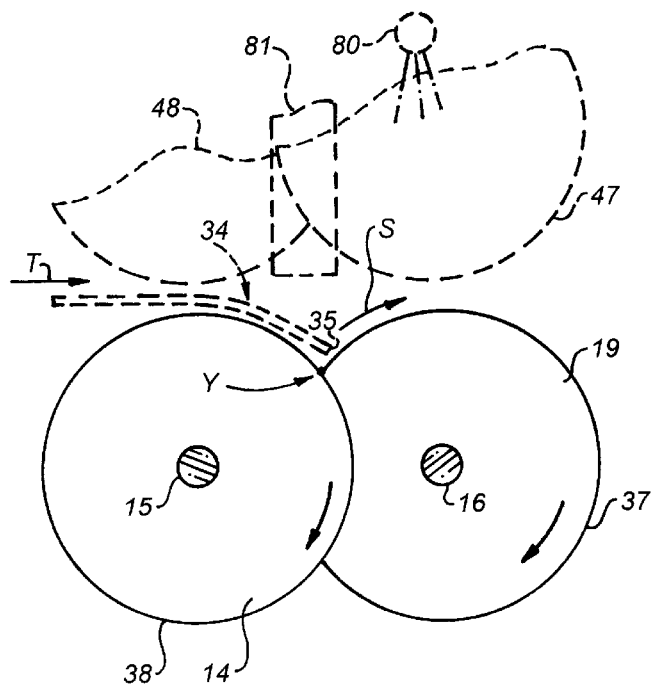

Imaginary longitudinal axis Y is parallel to axles 15 and 16 and is normal to each roller 11 to 14 and 17 to 19. In FIG. 6, axis Y is perpendicular to the plane of the sheet of paper of the drawing. When rollers 11 to 14 and 17 to 19 rotate in the directions indicated by arrow L and M, the cylindrical peripheral edges 37 to 39 rotate by and immediately adjacent axis Y. Although the position of baffle 20 between axles 15 and 16 and with respect to rollers 11 to 14 and 17 to 19 can vary as desired, in FIGS. 1 and 2 the upper wave-shaped edge 22 has a sine wave shape and is centered on and beneath axis Y. One cycle of baffle 20 consists of two consecutive bell-shaped portions of baffle 20, where each portion is on an opposite side of axis Y. Consequently, cycle C1 of baffle 20 begins at an imaginary plane 82 which extends across baffle 20 and is both normal to axis Y and intermediate rollers 12 and 17. Cycle C1 of baffle 20 ends at an imaginary plane 83 which extends across baffle 20 and is both normal to axis Y and intermediate rollers 13 and 18. Cycle C2 begins immediately after cycle C1 at imaginary plane 83 and ends at imaginary plane 84 which extends across baffle 20 and is both normal to axis Y and intermediate rollers 14 and 19. Cycle C1 includes a first bell-shaped half-cycle portion which curves around roller 12 and a second bell-shaped half-cycle portion which curves around roller 18. Cycle C2 includes a first bell-shaped half-cycle portion which curves around roller 13 and a second bell-shaped half-cycle portion which curves around roller 19. The amplitude of a bell-shaped portion and of baffle 20 is the distance, indicated by arrows F, from axis Y to the inside surface of the portion. For example, the amplitude of the bell-shaped half-cycle portion which curves around roller 13 is the distance F from axis Y to the inside surface 24 of the bell-shaped portion. Baffle 20 includes parallel spaced apart front and back wave-shaped surfaces 24 and 23. In FIG. 1, each bell-shaped half-cycle portion has the same amplitude, although as earlier noted this need not necessarily be the case.

The thickness, indicated by arrows P, of baffle 20 can vary as desired. The thickness P can vary along the length of baffle 20 but is presently preferably constant along the length of the baffle 20 and is in the range of 0.010 to 0.25 inch.

In FIG. 1, baffle 20 blocks fluid which is sprayed to the right of baffle 20 and helps prevent the fluid from traveling in the direction of arrow P to points to the left of baffle 20. Similarly, the baffle 20 helps block fluid which is sprayed to the left of baffle 20 from traveling in the direction of arrow Q to points to the right of baffle 20. Baffle 20 includes rectangular end surface 21. Baffle 20 helps prevent the contamination of areas to the side of baffle 20.

In FIG. 2, baffle 20 helps to block fluid which is sprayed 71, 73 to the right of baffle 20 from traveling to points to the left of baffle 20 in FIG. 2.

Baffle 25 in FIG. 3 is interdigitized between disk pairs 26-27, 27-28, 28-29.

The waveform baffle 57 in FIG. 5 includes rectangular end surface 58 having a width W, top planar surface 59, bottom planar surface 30 parallel to surface 59, front wave surface 31, and rear wave surface 32 parallel to surface 31. Elongate orthogonal slots 60 to 63 formed through baffle 57 each have an equivalent shape and dimension and permit air or another fluid to be directed upwardly into the slots in the direction of arrow A such that air flows upwardly out of each slot in the directions indicated by arrows B to E in FIG. 5. Baffle 57 can be utilized as a squeegee which uses a stream of fluid to sweep or remove a fluid off the surface of a substrate sheet 74. Baffle 57 is positioned such that surface 59 is near or adjacent sheet 74. Such a baffle 57 is advantageous because when a sheet 74 normally travels from rollers 17 to 19 onto a squeegee roller, there often is a space between rollers 17 to 19 and the cylindrical squeegee roller. The leading edge of sheet 74 can travel from rollers 17 to 19 down into this space so that sheet 74 never reaches the squeegee roller. In contrast to the squeegee roller, when baffle 57 is utilized, portions of baffle 57 are interdigitized between the rollers 17 to 19 in the manner indicated by dashed lines 57 in FIG. 1. The leading edge of sheet 74 then contacts the interdigitized portions of baffle 57 and is generally prevented from traveling downwardly from the desired plane of travel of sheet 74 on top of rollers 17 to 19 in the direction of arrow T. When baffle 57 is installed adjacent rollers 17 to 19, axis X at the end 58 of baffle 57 ordinarily is spaced apart from and is perpendicular to axis Y. While the orientation of each slot 60 to 63 can vary as desired, in FIG. 5 each slot is vertically oriented and is parallel to axis X.

In FIG. 2, the upper edge 22 of baffle 20 ordinarily, but not necessarily, is positioned beneath or no higher than axis Y. It typically is not desirable to have the leading edge 35 of a substrate sheet 34 contact edge 22.

FIG. 6 illustrates interdigitized rollers 47, 48, 37, 38 on top of and beneath a substrate sheet 34. If desired each roller 47, 48, 37, 38 can contact sheet 34 and facilitate its travel in the direction of arrow T. When sheet 34 is pliable, the leading edge 35 can travel from roller 38 downwardly to the position illustrated in FIG. 6. When edge 35 contacts interdigitized roller 37, roller 37 usually causes edge 35 to move upwardly in the direction of arrow S. If roller 37 were not interdigitized, roller 37 likely would not halt the downward travel of edge 35 between rollers 38 and 37.

In FIG. 2, baffle 20 is vertically oriented. Baffle 20 may, if desired, be tilted or canted from the vertical.

Dashed lines 80 and 81 in FIG. 6 illustrate a spray bar and waveform baffle, respectively, incorporated in interdigitized disks positioned above a substrate 34 passing through the apparatus of the invention.

The apparatus of the invention can be utilized to process substrates which are rigid or pliable. Such substrates can, by way of example and not limitation, include circuit board substrates, semiconductor wafers, and glass panels.

Slots 60 to 63 each have a rectangular cross-section. Slots 60 to 63 can, however, take on any desired shape and dimension including, for example, the waveform shape indicated by dashed lines 82. The waveform shape of a slot 60 to 63 can comprise part of a cycle, one cycle, or more than one cycle of a desired waveform. If desired, only one slot need be formed in baffle 57.

Having described my invention in such terms as to enable those skilled in the art to understand and practice it, and having identified the presently preferred embodiments thereof, I claim:

1. Apparatus for directing a stream of fluid against a substrate traveling through said apparatus, said substrate having first and second opposed generally parallel planar surfaces, said apparatus comprising:
    (a) a conveyor table for transporting said substrate, said conveyor table including
        (i) a first horizontally disposed axle carrying a first set of circular rollers contacting and supporting said first planar surface of said substrate in a generally horizontal orientation as said substrate moves over said rollers, and
        (ii) a second horizontally disposed axle generally parallel to said first axle and carrying a plurality of circular rollers contacting and supporting said first planar surface of said substrate in a generally horizontal orientation as said substrate moves over said rollers on said second axle, said rollers on said second axle being interdigitized with said rollers on said first axle;
    (b) waveform shaped baffle means interdigitized with said rollers on said first axle and said rollers on said second axle: and,
    (c) fluid supply means.

2. A method for separating a first portion of treatment apparatus from a second portion of treatment apparatus, said apparatus directing a stream of fluid against a substrate traveling through said apparatus, said substrate having first and second opposed generally parallel planar surfaces, said apparatus including a conveyor table for transporting said substrate, said conveyor table comprising
    (a) a first horizontally disposed axle carrying a first set of circular rollers contacting and supporting said first planar surface of said substrate in a generally horizontal orientation as said substrate moves over said rollers,
    (b) a second horizontally disposed axle generally parallel to said first axle and carrying a plurality of circular rollers contacting and supporting said first planar surface of said substrate in a generally horizontal orientation as said substrate moves over said rollers on said second axle, said rollers on said second axle being interdigitized with said rollers on said first axle, and
    (c) fluid supply means;
said method including the step of interdigitizing waveform-shaped baffle means with said rollers on said first axle and said rollers on said second axle, said baffle means including interconnect half-cycle portions and being interdigitized with said rollers such that each of said half-cycle portions extending around one of the interdigitized disks on the first axle
    (d) has an amplitude sufficient to curve around said one of said interdigitized disks; and,
    (e) is connected to one of said half-cycle portions of said baffle means extending around one of said interdigitzed disks on said second axle and adjacent said one of said disks on said first axle.

3. Apparatus for directing a stream of fluid against a substrate traveling through said apparatus, said substrate having first and second opposed generally parallel planar surfaces, said apparatus comprising:
    (a) a conveyor table for transporting said substrate, said conveyor table including
        (i) a first horizontally disposed axle carrying a first set of circular rollers contacting and supporting said first planar surface of said substrate in a generally horizontal orientation as said substrate moves over said rollers, and
        (ii) a second horizontally disposed axle generally parallel to said first axle and carrying a plurality of circular rollers contacting and supporting said first planar surface of said substrate in a generally horizontal orientation as said substrate moves over said rollers on said second axle;
    (b) waveform shaped baffle means interdigitized with said rollers on said first axle and said rollers on said second axle to remove fluid from said substrate: and,
    (c) fluid supply means.

* * * * *